(12) United States Patent
Wichern et al.

(10) Patent No.: US 6,794,941 B2
(45) Date of Patent: Sep. 21, 2004

(54) GAIN-CONTROLLED AMPLIFIER WITH FIXED MINIMUM GAIN

(75) Inventors: Andreas Wichern, Hamburg (DE); Niels Gabriel, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/998,051

(22) Filed: Nov. 29, 2001

(65) Prior Publication Data

US 2002/0130717 A1 Sep. 19, 2002

(30) Foreign Application Priority Data

Nov. 30, 2000 (DE) .......................................... 100 59 867

(51) Int. Cl.[7] ................................................ H03F 3/45
(52) U.S. Cl. ....................... 330/254; 330/252; 327/355; 327/359
(58) Field of Search ................................. 330/254, 252; 327/355, 359; 326/112

(56) References Cited

U.S. PATENT DOCUMENTS

| 5,933,771 | A | * | 8/1999 | Tiller et al. ................... 455/33 |
| 5,945,847 | A | * | 8/1999 | Ransijn ....................... 326/112 |
| 6,046,640 | A | * | 4/2000 | Brunner ....................... 330/254 |
| 6,177,839 | B1 | * | 1/2001 | Ishihara ...................... 330/254 |

* cited by examiner

*Primary Examiner*—Michael Tokar
*Assistant Examiner*—Linh Van Nguyen
(74) *Attorney, Agent, or Firm*—Michael J. Ure

(57) ABSTRACT

A gain-controlled amplifier comprises two signal output stages arranged in parallel to drive an output load in series. A maximum-gain stage provides a maximum of signal gain and the other minimum-gain stage fixes the minimum overall amplifier signal gain. Gain-control input signals differentially applied to the two such stages balance the contributions of the respective gain stages delivered to the common output load. In one aspect, a third shunting transistor is used across the minimum-gain stage. In another version, the output load is a tapped resistor and the respective maximum and minimum gain stages drive different taps.

8 Claims, 3 Drawing Sheets

GAIN-CONTROLLED AMPLIFIER WITH FIXED MINIMUM GAIN

CLAIM OF PRIORITY

This application claims priority based on German Patent Application No. 10059867.6, filed 30 Nov. 2000.

TECHNICAL FIELD OF THE INVENTION

The invention relates to a controllable amplifier arrangement. The invention also relates to an arrangement for processing electric signals by means of at least one such controllable amplifier arrangement.

BACKGROUND OF THE INVENTION

In arrangements and systems for receiving high-frequency electric or electromagnetic signals, control circuits with controllable amplifier arrangements are often required for different purposes and at different positions. For example, in such an arrangement or such a system, the amplitude of a received signal is to be maintained constant or to be limited via a control loop for further signal processing, for example, in a demodulator. For larger control ranges of such control loops, controllable amplifiers are required which must be controllable via a large range of values of their gain factor. Such controllable amplifiers may to this end comprise a plurality of controllable amplifier arrangements, also referred to as single amplifier stages, because the desired maximal overall gain of the controllable amplifier cannot often be achieved with a single amplifier stage.

SUMMARY OF THE INVENTION

When using such a controllable amplifier in a control loop of the type described, the gain factors of the last single amplifier stages, arranged in a chain, of the controllable amplifier are first reduced when the amplitude of the signal to be processed increases. It has proved that the behavior of the controllable amplifier as regards noise and distortions is then most favorable. Also when the amplitude of the signals to be processed is strongly increased at the input of the controllable amplifier, the gain factor of the single amplifier stages must not fall below a predetermined value because the signal to be processed must be passed through the single amplifier stages with the appropriate amplitude in order that it is still available at the output of the controllable amplifier.

It is an object of the invention to provide a simple and reliable controllable amplifier arrangement as well as an arrangement for processing electric signals by means of at least one such amplifier arrangement, with which a predetermined minimal gain, i.e. a predetermined minimal value of the gain factor can be adjusted.

According to the invention, this object is solved by a controllable amplifier arrangement comprising
  a first differential amplifier stage having a first and a second output branch,
  a second differential amplifier stage which is coupled to the first output branch of the first differential amplifier stage and has at least a first and a second output branch, at which a first current in the first output branch of the first differential amplifier stage is controllably divided into partial currents,
  a third differential amplifier stage which is coupled to the second output branch of the first differential amplifier stage and has at least a first and a second output branch, at which a second current in the second output branch of the first differential amplifier stage is controllably divided into partial currents,
  a first load impedance coupled to one of the first output branches of the second differential amplifier stage for generating a first output voltage from the partial current flowing in said one of the first output branches of the second differential amplifier stage, and
  a second load impedance coupled to one of the first output branches of the third differential amplifier stage for generating a second output voltage from the partial current flowing in said one of the first output branches of the third differential amplifier stage. In this controllable amplifier arrangement, the first and the second load impedance are bridged to a predetermined part by at least one of the second output branches of the second and third differential amplifier stages, respectively.

In the controllable amplifier arrangement according to the invention, the first differential amplifier stage is used for amplifying an electric signal to be processed, for example in a system for receiving high-frequency electric signals. The second and third differential amplifier stage are used for dividing the output currents of the first differential amplifier stage optionally between the load impedances or for at least partly bridging them. Voltages then occur at the load impedances, which are only generated by the part of the current for the signal to be processed, which current flows through these load impedances. By adjusting this part of the currents, the gain factor of the controllable amplifier arrangement can be adjusted to predetermined values. This adjustment may be performed very precisely because it is based on the adjustment of a current ratio which can be realized very accurately, particularly in the integrated circuit technique.

Moreover, the controllable amplifier arrangement according to the invention uses only a single differential amplifier for amplifying the signal to be processed and therefore has a very simple structure.

According to the invention, the object is further solved by an arrangement for processing electric signals which comprises at least one of the controllable amplifier arrangements described above.

In an advantageous embodiment of the controllable amplifier arrangement according to the invention, said one of the second output branches of the second differential amplifier stage has two jointly controlled sub-branches, a first sub-branch of which is coupled to the first load impedance. Moreover, said one of the second output branches of the third differential amplifier stage has two jointly controlled sub-branches, a first sub-branch of which is coupled to the second load impedance.

In this embodiment of the controllable amplifier arrangement according to the invention, the desired minimal gain, i.e. the desired minimal value of the gain factor is determined by a current ratio in the sub-branches of the second output branches of the second and the third differential amplifier stage. When these sub-branches are particularly provided with bipolar transistors, said current ratio can be predetermined in a very easy and precise manner via the ratios of the emitter areas of these transistors in the different sub-branches.

In a further embodiment of the controllable amplifier arrangement according to the invention, said one of the second output branches of the second differential amplifier stage is coupled to a tap on the first load impedance, and said one of the second output branches of the third differential amplifier stage is coupled to a tap on the second load impedance.

Due to such an arrangement, which also uses only a first differential amplifier stage for amplifying the signal, a further simplification of the circuit is achieved. The minimal gain is predetermined by an impedance ratio which is determined by the arrangement of taps. When particularly ohmic load impedances are used, the minimal gain is determined from a resistance ratio which is reproducible in a very precise way, particularly in the integrated circuit technique. This provides the possibility of maintaining strict tolerances in spite of the lower costs of bulk manufacture.

In an advantageous further embodiment of the arrangement according to the invention, using at least two controllable amplifier arrangements of the type described hereinbefore, the second and the third differential amplifier stage of the controllable amplifier arrangements are controllable by means of common control signals and have control characteristics which are mutually offset in such a way that the partial currents flowing in the output branches of the second and the third differential amplifier stage are reversed in the individual controllable amplifier arrangements at different values of the common control signals.

A desired sequence of the gain control of the individual controllable amplifier arrangements, i.e. single amplifier stages is thereby possible without any additional circuit-technical measures in such an arrangement.

In such an arrangement, the output branches of the second and the third differential amplifier stage are formed with transistors whose main current paths have current-conveying cross-sectional areas whose dimensioning determines the reversal of the partial currents in the output branches of the second and third differential amplifier stages of the individual controllable amplifier arrangements at the different values of the common control signals in the individual controllable amplifier arrangements.

Due to this implementation of the arrangement according to the invention, the described reversal of said partial currents in the individual controllable amplifier arrangements is possible in a very simple and precise manner at different values of the common control signals.

These and other aspects of the invention are apparent from and will be elucidated with reference to the embodiments described hereinafter.

DETAILED DESCRIPTION OF THE INVENTION

Figure 1:
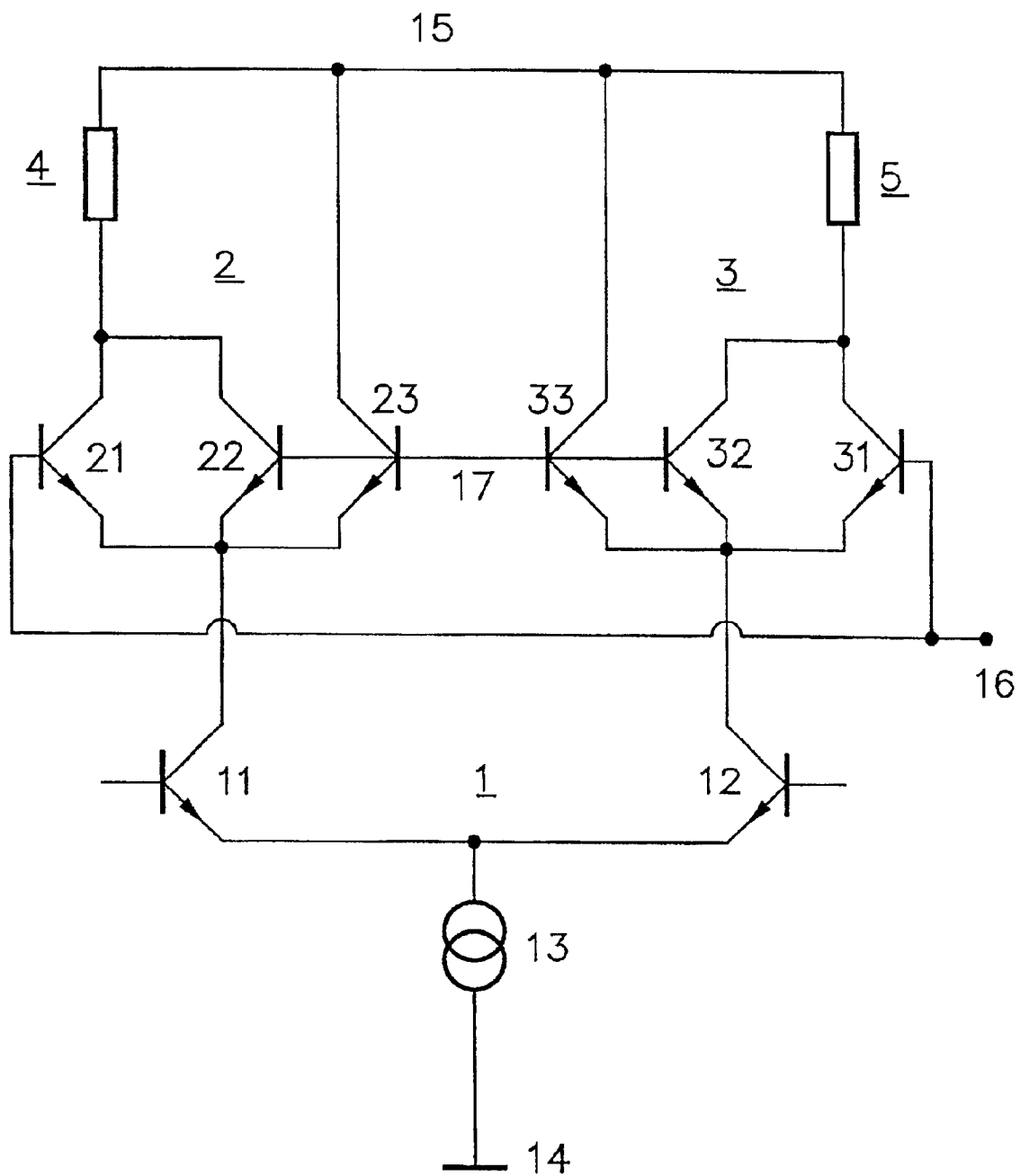
FIG. 1, a first embodiment of the controllable amplifier arrangement according to the invention, FIG. 2, a second embodiment of the controllable amplifier arrangement according to the invention, and FIG. 3, an embodiment of an arrangement according to the invention, with two controllable amplifier arrangements according to the invention.

In the Figures, identical elements are denoted by the same reference numerals.

The embodiment of the controllable amplifier arrangement shown in FIG. 1 comprises a first differential amplifier stage 1 consisting of two bipolar transistors 11, 12 of the NPN type whose interconnected emitters are connected to ground 14 via a DC source 13.

A second differential amplifier stage 2 comprises a third bipolar transistor 21, a fourth bipolar transistor 22 and a fifth bipolar transistor 23. The third, fourth and fifth bipolar transistors 21, 22, 23 are also of the NPN type. The third bipolar transistor constitutes a first output branch of the second differential amplifier stage 2. The fourth bipolar transistor 22 constitutes a first sub-branch of the second output branch and the fifth bipolar transistor 23 constitutes a second sub-branch of the second output branch of the second differential amplifier stage 2. The emitters of the third, fourth and fifth bipolar transistors 21, 22, 23 are connected to a collector of the first bipolar transistor 11 so that the second differential amplifier stage 2 is connected to the first output branch of the first differential amplifier stage 1. A collector of the fifth bipolar transistor 23 is connected to a power supply terminal 15. Collectors of the third and fourth bipolar transistors 21, 22 are connected together to a first terminal of a first load impedance 4 which is connected to the current power supply terminal 15 at the other end. The first load impedance 4 is preferably formed as an ohmic resistor.

A third differential amplifier stage 3 is preferably a mirror image of the second differential amplifier stage 2 and comprises a sixth bipolar transistor 31, which constitutes a first output branch of the third differential amplifier stage, a seventh bipolar transistor 32, which constitutes a first sub-branch of a second output branch of the third differential amplifier stage 3, and an eighth bipolar transistor 33 which constitutes a second sub-branch of the second output branch of the third differential amplifier stage 3. The sixth, seventh and eighth bipolar transistors 31, 32, 33 are also of the NPN type and their emitters are jointly connected to a collector of the second bipolar transistor 12. In this way, the second output branch of the first differential amplifier stage 1 is coupled to the third differential amplifier stage 3. A collector of the eighth bipolar transistor 33 is connected to the power supply terminal 15, and collectors of the sixth and seventh bipolar transistors 31, 32 are connected together to a first terminal of a second load impedance 5 which is also connected to the power supply terminal 15 at the other end.

Bases of the first and second bipolar transistors 11, 12 constitute input terminals for a signal to be processed, which, after amplification in the first differential amplifier stage 1, can be tapped from the connected collectors of the third and fourth bipolar transistors 21, 22 and the sixth and seventh bipolar transistors 31, 32, respectively. The bases of the third and sixth bipolar transistors 21, 31 are connected to a first control terminal 16. In a corresponding manner, bases of the fourth, fifth, seventh and eighth bipolar transistors 22, 23, 32, 33 are jointly connected to a second control terminal 17. A control signal for reversing the first or the second output branches of the second and third differential amplifier stages 2, 3 can be applied between the first and the second control terminal 16, 17 in such a way that the first or the second output branches of the second and the third differential amplifier stage 2, 3 can be optionally controlled in a conducting manner to a predetermined extent. As a result, currents in the output branches of the first differential amplifier stage 1 optionally flow to a predetermined extent through the first or the second output branches of the second and third differential amplifier stages 2, 3.

In the case of operation of the controllable amplifier arrangement shown in FIG. 1, a current modulated by the input signal at the bases of the first and second bipolar transistors 11, 12 flows in the output branches of the first differential amplifier stage 1. When the potential at the first control terminal 16 is chosen to be sufficiently large with respect to the potential at the second control terminal 17, the currents from the output branches of the first differential amplifier stage 1 flow through the first output branches of the second and third differential amplifier stages 2, 3 as well as through the load impedances 4, 5. The controllable amplifier arrangement is thereby adjusted to its maximal gain factor.

When the potential at the first control terminal 16 is decreased with respect to that at the second control terminal 17, an increasing part of the currents in the output branches of the first differential amplifier stage 1 no longer flows through the first output branches of the second and third differential amplifier stages 2, 3 but through their second output branches. Here, they are divided into the sub-branches. The current portions through the first sub-branches, constituted by the fourth and seventh bipolar transistors 22 and 32, respectively, also flow to the load impedances 4 and 5 and therefore contribute to the gain of the input signal applied via the bases of the transistors 11, 12 to the first differential amplifier stage 1. The current portions through the second sub-branches, constituted by the fifth and eighth bipolar transistors 23, 33, respectively, flow, however, directly to the power supply terminal 15 and thus do not contribute to the signal gain. To the extent that the potentials at the first and second control terminals 16, 17 are further shifted in the way described, the currents from the output branches of the first differential amplifier stage 1 are diverted to the second output branches of the second and third differential amplifier stages 2, 3. In the final state, when the potential at the first control terminal 16 is essentially lower than at the second control terminal 17, no currents flow any more in the first output branches, i.e. in the third and sixth bipolar transistors 21, 31. In this state of operation, only the partial currents in the first sub-branches of the second output branches of the second and third differential amplifier stages 2, 3, i.e. in the fourth and seventh bipolar transistors 22, 32 contribute to the gain. The gain factor of the controllable amplifier arrangement is thus reduced by an extent which is predetermined by the current division between the fourth and fifth and the seventh and eighth bipolar transistors 22, 23 and 32, 33, respectively. This current ratio can be adjusted in a very precise way by the ratios of the emitter areas of said bipolar transistors. A minimal gain can thereby be predetermined in a simple and accurate manner.

Figure 2:
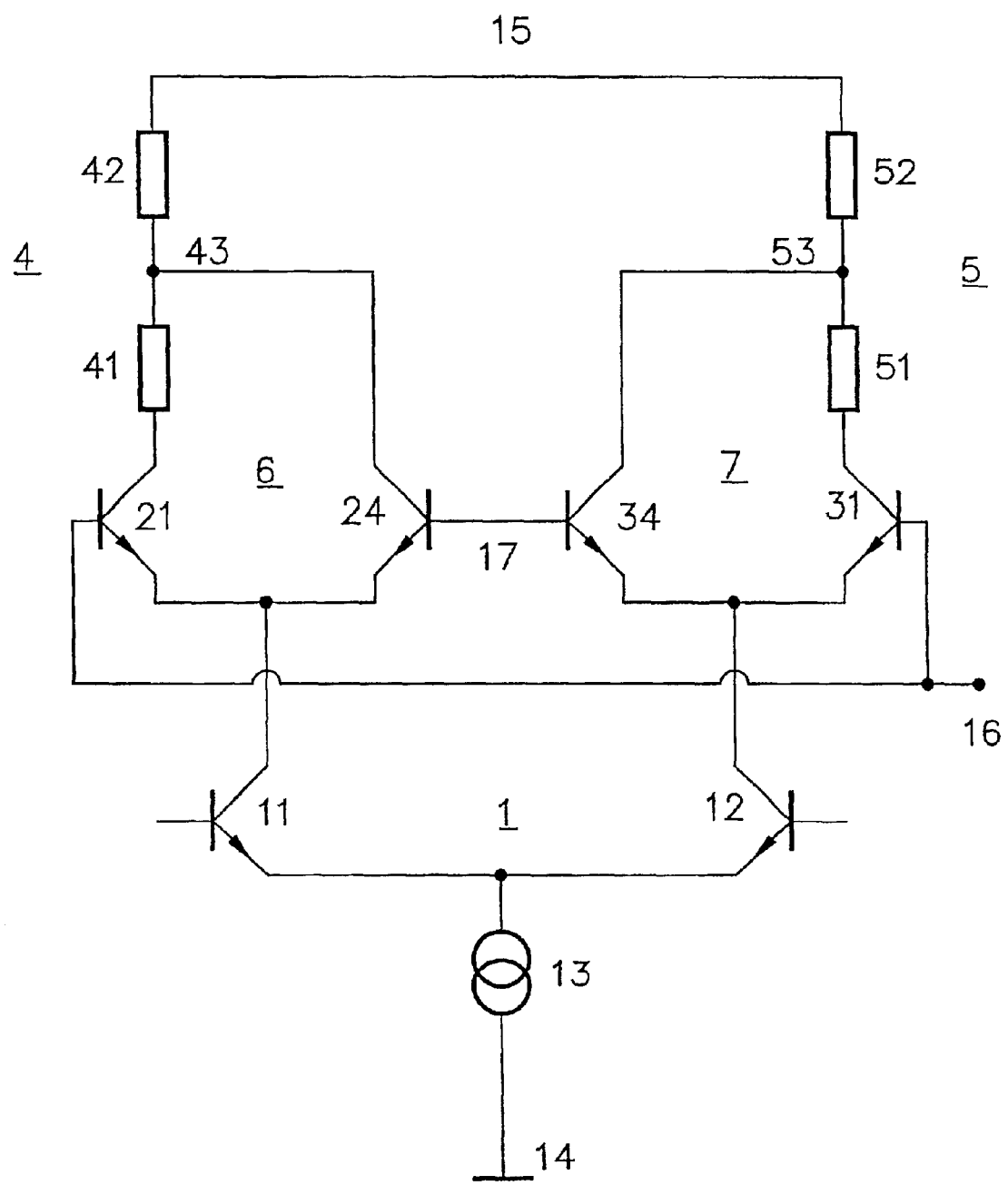

As a second embodiment of the controllable amplifier arrangement according to the invention, FIG. 2 shows a modification of the arrangement of FIG. 1, in which simplified circuits are used for the second and third differential amplifier stages, denoted by the reference numerals 6 and 7, respectively. In these embodiments, the second and third differential amplifier stages 6 and 7 each comprise a bipolar transistor as a second output branch, namely the ninth bipolar transistor 24, which constitutes the second output branch of the second differential amplifier stage 6, and the tenth bipolar transistor 34, which constitutes the second output branch of the third differential amplifier stage 7. The bases of the ninth and tenth bipolar transistors 24, 34, which are again of the NPN type, are connected again to the second control terminal 17. Collectors of the ninth and tenth bipolar transistors 24, 34 are connected to taps 43 and 53 of the load impedances 4 and 5, respectively. In the embodiment of FIG. 2, they comprise two sub-impedances 41, 42 and 51, 52, respectively, arranged per load impedance in series between the first output branch (collector) of the second and third differential amplifier stages 6 and 7 and the power supply terminal 15.

In this embodiment of the controllable amplifier arrangement according to the invention, the currents in the output branches of the first differential amplifier stage 1 are subdivided in accordance with the electric potentials across the first and second control terminals 16, 17, across the third and sixth bipolar transistors 21, 31 or across the ninth and tenth bipolar transistors 24, 34. The currents in the first output branches of the second and third differential amplifier stages 6, 7, i.e. in the collectors of the third and sixth bipolar transistors 21, 31, generate a signal voltage at the overall load impedances 4, 5, whereas the currents in the second output branches, i.e. in the collectors of the ninth and tenth bipolar transistors 24, 34, generate voltages only at the second sub-impedances 42, 52. The amplitudes of the voltages at the subimpedances 42, 52 are smaller than the amplitudes at the overall load impedances 4, 5. By reversing the currents in the output branches of the first differential amplifier stage 1 from the first output branches of the second and third differential amplifier stages 6, 7 to their second output branches, the gain factor of the controllable amplifier arrangement of FIG. 2 is thus decreased. This decrease is effected continuously by means of a control signal at the control terminals 16, 17. The minimal gain is determined from the mutual ratio of the values of the sub-impedances 41, 42 and 51, 52. The ratio between the impedance values of the second sub-impedances 42, 52 and the impedance value of the overall load impedance 4, 5 corresponds to the decrease of the gain factor of the controllable amplifier arrangement as against its maximal gain factor. For example, when the impedance value of the second sub-impedances 42, 52 is one tenth of the impedance value of the overall load impedance 4, 5, the minimal gain is one tenth of the maximal gain factor.

Only one first differential amplifier stage is required, also in this embodiment. As compared with the embodiment of FIG. 1, a further saving of components is achieved. The load impedances 4, 5 are preferably formed as ohmic resistors. Resistance ratios can be reproduced with great accuracy during manufacture, particularly in the integrated circuit technique, so that a very reliable circuit arrangement can be obtained with a small number of components.

Figure 3:
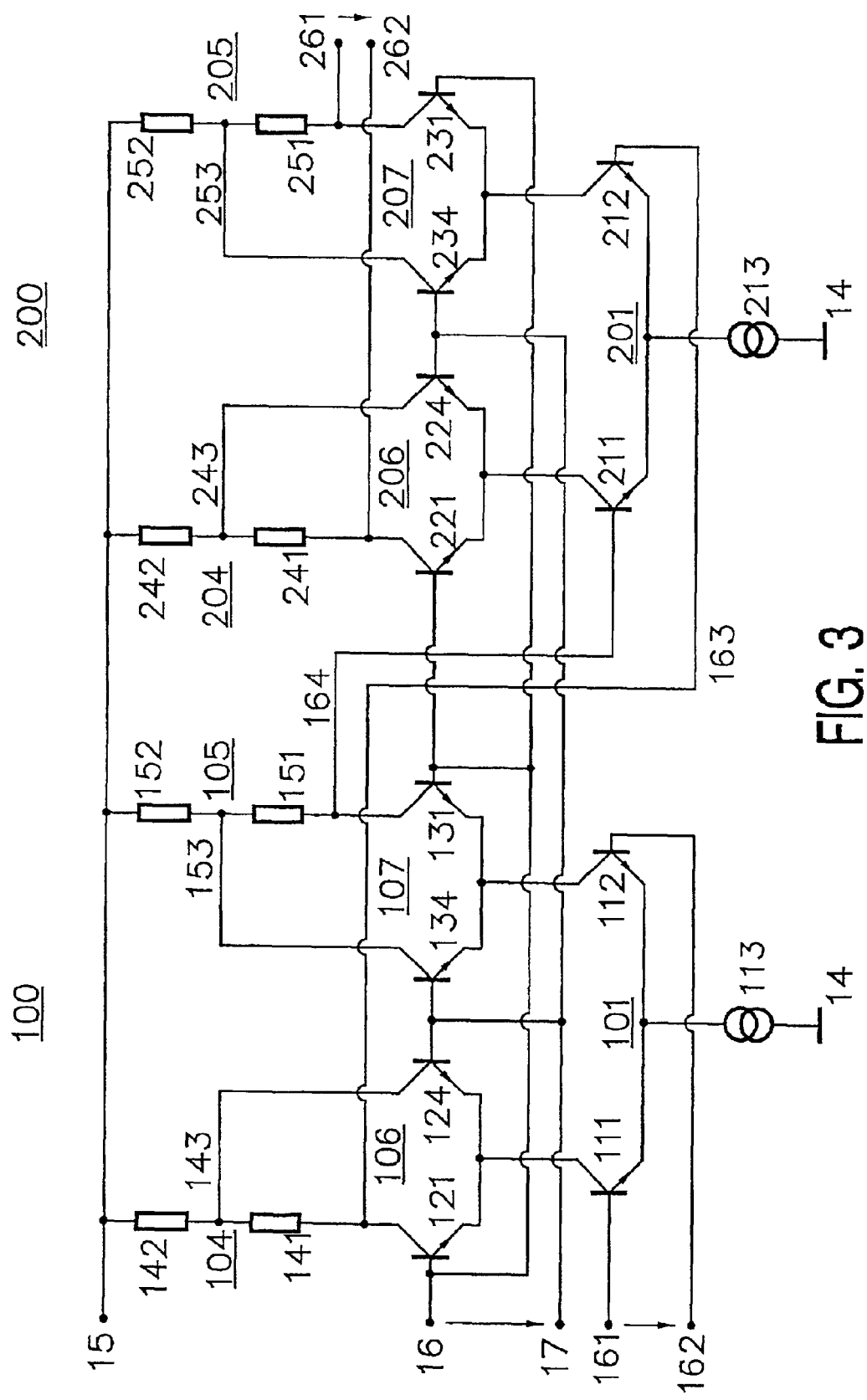

FIG. 3 shows an embodiment of an arrangement comprising a first controllable amplifier arrangement 100 and a second controllable amplifier arrangement 200 each constructed in accordance with the embodiment of FIG. 2 and whose elements have reference numerals which are derived from corresponding elements in FIG. 2, namely by addition of the number 100 to the reference numeral of the relevant element for the first controllable amplifier arrangement 100 and by addition of the number 200 to the reference numeral of the relevant element of the second controllable amplifier arrangement 200. The details are shown in the appended list of reference numerals.

Via input terminals 161, 162, which are connected to the bases of the first and second bipolar transistors 111 and 112, respectively, an input signal to be amplified is applied to the first controllable amplifier arrangement 100. The collectors of the third and sixth bipolar transistors 121, 131 of the first controllable amplifier arrangement 100 are used as outputs and are connected via connections 163, 164 to the bases of the first and second bipolar transistors 211, 212 of the second controllable amplifier arrangement 200. The collector terminals of the third and sixth bipolar transistors 221, 231 of the second controllable amplifier arrangement 200 are connected to output terminals 261, 262 for supplying an amplified output signal. The bases of the transistors of the second and third differential amplifier stages 106, 107, 206, 207 are connected in the manner described with reference to FIG. 2 to the control terminals 16, 17 which are common for the two controllable amplifier arrangements 100, 200. The gain factors of the two controllable amplifier arrangements are jointly controlled via these terminals. The gain factors of the individual amplifier arrangements 100, 200 are consecutively reversed when the ninth and tenth bipolar transistors 124, 134 and 224, 234 in the respective amplifier arrangements 100 and 200 are formed with different emitter areas. The control sequence for the individual controllable amplifier arrangements 100, 200 is then fixed via the ratio of these emitter areas.

In further modifications of the circuit arrangement according to the invention, not only arrangements having a larger number of controllable amplifier arrangements can be used, but also transistors of, for example, a different type may be used, for example of the opposite conductivity type or in the form of field effect transistors.

In a first dimensioning example of the arrangement of FIG. 3, the ninth and tenth bipolar transistors 124, 134 of the first controllable amplifier arrangement 100 and the third and sixth bipolar transistors 221, 231 of the second controllable amplifier arrangement 200 have larger emitter areas than the third and sixth bipolar transistors 121, 131 of the first controllable amplifier arrangement 100 and the ninth and tenth bipolar transistors 224, 234 of the second controllable amplifier arrangement 200. When a voltage applied in the direction of the arrow as a control signal between the first and the second control terminal 16, 17 is continuously decreased, the first controllable amplifier arrangement 100 is the first to decrease its gain factor. When this relation between the emitter areas is exchanged, the second controllable amplifier arrangement 200 is the first to decrease the gain factor.

In a modification of the above-described dimensioning example of the arrangement of FIG. 3, the emitter areas of only one of the two controllable amplifier arrangements 100, 200 may also be dimensioned in the manner shown.

List of Reference Numerals 1 first differential amplifier stage
2 second differential amplifier stage (FIG. 1)
3 third differential amplifier stage (FIG. 1)
4 first load impedance
5 second load impedance
6 second differential amplifier stage (FIG. 2)
7 third differential amplifier stage (FIG. 2)
11 first bipolar transistor, NPN type: constitutes first output branch of 1
12 second bipolar transistor, NPN type: constitutes second output branch of 1
13 DC source
14 ground
15 power supply terminal
16 first control terminal
17 second control terminal
21 third bipolar transistor, NPN type: constitutes first output branch of 2 (FIG. 1) and of 6 (FIG. 2)
22 fourth bipolar transistor, NPN type: constitutes first sub-branch of the second output branch of 2 (FIG. 1)
23 fifth bipolar transistor, NPN type: constitutes second sub-branch of the second output branch of 2 (FIG. 1)
24 ninth bipolar transistor, NPN type: constitutes second output branch of 6 (FIG.2)
31 sixth bipolar transistor, NPN type: constitutes first output branch of 3 (FIG. 1) and of 6 (FIG. 2)
32 seventh bipolar transistor, NPN type: constitutes first sub-branch of the second output branch of 3 (FIG. 1)
33 eighth bipolar transistor, NPN type: constitutes second sub-branch of the second output branch of 3 (FIG. 1)
34 tenth bipolar transistor, NPN type: constitutes second output branch of 7 (FIG. 2)
41 first sub-impedance of 4
42 second sub-impedance of 4
43 tap of 4
51 first sub-impedance of 5
52 second sub-impedance of 5
53 tap of 5
100 first controllable amplifier arrangement (FIG. 3)
101 first differential amplifier stage of 100 (FIG. 3)
104 first load impedance of 100 (FIG. 3)
105 second load impedance of 100 (FIG. 3)
106 second differential amplifier stage of 100 (FIG. 3)
107 third differential amplifier stage of 100 (FIG. 3)
111 first bipolar transistor of 100, NPN type: constitutes_ first_output_branch of 101 (FIG. 3)
112 second bipolar transistor of 100, NPN_type:_ constitutes_second output branch_of_101 (FIG. 3)
113 DC source of 100 (FIG. 3)
121 third bipolar transistor of 100, NPN type: constitutes first output branch of 106 (FIG. 3)
124 ninth bipolar transistor of 100, NPN type: constitutes second output branch of 106 (FIG. 3)
131 sixth bipolar transistor of 100, NPN type: constitutes first output branch of 107 (FIG. 3)
134 tenth bipolar transistor of 100, NPN type: constitutes second output branch of 107 (FIG. 3)
141 first sub-impedance of 104 (FIG. 3)
142 second sub-impedance of 104 (FIG. 3)
143 tap of 104 (FIG. 3)
151 first sub-impedance of 105 (FIG. 3)
152 second sub-impedance of 105 (FIG. 3)
153 tap of 105 (FIG. 3)
161 first input terminal (for a signal to be amplified) (FIG. 3)
162 second input terminal (for a signal to be amplified) (FIG. 3)
163 first connection (FIG. 3)
164 second connection (FIG. 3)
200 second controllable amplifier arrangement (FIG. 3)
201 first differential amplifier stage of 200 (FIG. 3)
204 first load impedance of 200 (FIG. 3)
205 second load impedance of 200 (FIG. 3)
206 second differential amplifier stage of 200 (FIG. 3)
207 third differential amplifier stage of 200 (FIG. 3)
211 first bipolar transistor of 200, NPN type: constitutes fist output branch of 201 (FIG. 3)
212 second bipolar transistor of 200, NPN type: constitutes second output branch of 201 (FIG. 3)
213 DC source of 200 (FIG. 3)
221 third bipolar transistor of 200, NPN type: constitutes first output branch of 206 (FIG. 3)
224 ninth bipolar transistor of 200, NPN type: constitutes second output branch of 206 (FIG. 3)
231 sixth bipolar transistor of 200, NPN type: constitutes first output branch of 207 (FIG. 3)
234 tenth bipolar transistor of 200, NPN type: constitutes second output branch of 207 (FIG. 3)
241 first sub-impedance of 204 (FIG. 3)
242 second sub-impedance of 204 (FIG. 3)
243 tap of 204 (FIG. 3)
251 first sub-impedance of 205 (FIG. 3)
252 second sub-impedance of 205 (FIG. 3)
253 tap of 205 (FIG. 3)
261 first output terminal of 200 (for amplified signal) (FIG. 3)
262 second output terminal of 200 (for amplified signal) (FIG. 3)

What is claimed is:

1. A gain-controlled amplifier with a fixed minimum gain, comprising:

an output load (4) across which a variable gain output signal is provided;

a first gain-control output transistor (21) with its output connected to drive the output load (4) and an input to receive a first gain-control signal (16);

a second gain-control output transistor (22) with its output connected in parallel with first gain-control output transistor (21) to drive the output load (4) and an input to receive a second gain-control signal (17);

a third gain-control output transistor (23) with its output connected in shunt with the output load (4) and an input to receive said second gain-control signal (17); and an output-transistor signal input connected in parallel with all three of the first, second, and third gain-control output transistors (21–22);

wherein, said first and second gain-control signals (16–17) when varied relative to one another will balance the contributions of amplified output signals to the output load (4) by the first and second gain-control output transistors (21–22) and an output-load shunting effect of the third gain-control output transistor (23);

wherein, a minimum amplifier gain is determined by the combination of the output load (4) driven by the second gain-control output transistor (22) and shunted by the third gain-control output transistor (23); and wherein, a maximum amplifier gain is determined by the combination of the output load (4) driven by the first gain-control output transistor (21).

2. The gain-controlled amplifier of claim 1, wherein:

the first, second, and third gain-control output transistors (21–23) are bipolar types and have their emitters connected in parallel, and such provides for the output-transistor signal input;

the first and second gain-control output transistors (21–22) have their collectors connected in parallel; and the second and third gain-control output transistors (22–23) have their bases connected in parallel.

3. A gain-controlled differential amplifier with a fixed minimum gain, comprising:

a differential output load (4–5) across which a variable-gain differential-output signal is provided, a first gain-control output transistor (21) with its output connected to drive the output load (4) and an input to receive a first gain-control signal (16);

a second gain-control output transistor (22) with its output connected in parallel with first gain-control output transistor (21) to drive the output load (4) and an input to receive a second gain-control signal (17);

a third gain-control output transistor (23) with its output connected in shunt with the output load (4) and an input to receive said second gain-control signal (17); and a first differential output-transistor signal input connected in parallel with all three of the first, second, and third gain-control output transistors (21–22);

a fourth gain-control output transistor (31) with its output connected to drive the output load (5) and an input to receive a fourth gain-control signal (16);

a fifth gain-control output transistor (32) with its output connected in parallel with fourth gain-control output transistor (21) to drive the output load (5) and an input to receive a fifth gain-control signal (17);

a sixth gain-control output transistor (33) with its output connected in shunt with the output load (5) and an input to receive said fifth gain-control signal (17); and a second differential output-transistor signal input connected in parallel with all three of the fourth, fifth, and sixth gain-control output transistors (31–32);

wherein, said fourth and fifth gain-control signals (16–17) when varied relative to one another will balance the contributions of amplified output signals to the output load (5) by the fourth and fifth gain-control output transistors (31–32) and an output-load shunting effect of the sixth gain-control output transistor (33);

wherein, a minimum amplifier gain is determined by the combination of the output loads (4–5) driven by the second and fifth gain-control output transistors (22, 32) and shunted by the third and sixth gain-control output transistors (23, 33); and wherein, a maximum amplifier gain is determined by the combination of the output loads (4–5) driven by the first and fourth gain-control output transistors (21, 31).

4. The gain-controlled differential amplifier of claim 3, wherein:

the first, second, and third gain-control output transistors (21–23) are bipolar types and have their emitters connected in parallel, and such provides for the first differential output-transistor signal input;

the fourth, fifth, and sixth gain-control output transistors (31–33) are bipolar types and have their emitters connected in parallel, and such provides for the second differential output-transistor signal input;

the first and second gain-control output transistors (21–22) have their collectors connected in parallel;

the second and third gain-control output transistors (22–23) have their bases connected in parallel.

the fourth and fifth gain-control output transistors (31–32) have their collectors connected in parallel; and the fifth and sixth gain-control output transistors (32–33) have their bases connected in parallel.

5. A gain-controlled amplifier with a fixed minimum gain, comprising:

a tapped output load (41–42) across which a variable gain output signal is provided, and including a tap (43);

a first gain-control output transistor (21) with its output connected to drive the output load (41–42) and an input to receive a first gain-control signal (16);

a second gain-control output transistor (24) with its output connected to drive said tap (43) and an input to receive a second gain-control signal (17);

an output-transistor signal input connected in parallel with all both of the first and second gain-control output transistors (21, 24);

wherein, the combination of the first gain-control output transistor (21) and the whole of the tapped output load (41–42) provide for a maximum amplifier gain;

wherein, the combination of the second gain-control output transistor (24) and the tap (43) of the tapped output load (41–42) provide for a minimum amplifier gain; and wherein, said first and second gain-control signals (16–17) when varied relative to one another operate to balance the contributions of amplified output signals to the output load (41–42) by the first and second gain-control output transistors (21, 24).

6. The gain-controlled amplifier of claim 5, wherein:

the first and second gain-control output transistors (21, 24) are bipolar types and have their emitters connected in parallel, and such provides for the output-transistor signal input; and the first and second gain-control output transistors (21, 24) respectively receive the first and second gain-control signals (16–17) at their bases.

7. A gain-controlled differential amplifier with a fixed minimum gain, comprising:

a first tapped output load (41–42) across which a first variable-gain differential output signal is provided, and including a tap (43);

a second tapped output load (51–52) across which a second variable-gain differential output signal is provided, and including a tap (53);

a first gain-control output transistor (21) with its output connected to drive the output load (41–42) and an input to receive a first gain-control signal (16);

a second gain-control output transistor (24) with its output connected to drive said tap (43) and an input to receive a second gain-control signal (17);

a third gain-control output transistor (31) with its output connected to drive the output load (51–52) and an input to receive said first gain-control signal (16);

a fourth gain-control output transistor (34) with its output connected to drive said tap (53) and an input to receive said second gain-control signal (17);

a first output-transistor differential signal input connected in parallel with all both of the first and second gain-control output transistors (21, 24);

a second output-transistor differential signal input connected in parallel with all both of the third and fourth gain-control output transistors (31, 34);

wherein, the combination of the first gain-control output transistor (21) and the whole of the tapped output load (41–42), and the combination of the third gain-control output transistor (31) and the whole of the tapped output load (51–52), provide for a maximum amplifier gain;

wherein, the combination of the second gain-control output transistor (24) and the tap (43) of the tapped output load (41–42), and the combination of the fourth gain-control output transistor (34) and the tap (53) of the tapped output load (51–52), provide for a minimum amplifier gain; and wherein, said first and second gain-control signals (16–17) when varied relative to one another operate to balance the contributions of amplified output signals to the output loads (41–42, and 51–52) by the first through fourth gain-control output transistors (21, 24, 31, and 34).

8. The gain-controlled differential amplifier of claim 7, wherein:

the first and second gain-control output transistors (21, 24) are bipolar types and have their emitters connected in parallel, and such provides for the first output-transistor signal input;

the third and fourth gain-control output transistors (31, 34) are bipolar types and have their emitters connected in parallel, and such provides for the second output-transistor signal input; and the first through fourth gain-control output transistors (21, 24, 31, and 34) respectively receive the first and second gain-control signals (16–17) at their bases.

\* \* \* \* \*